United States Patent
Akhter et al.

(10) Patent No.: US 8,989,257 B1
(45) Date of Patent: Mar. 24, 2015

(54) METHOD AND APPARATUS FOR PROVIDING NEAR-ZERO JITTER REAL-TIME COMPRESSION IN A COMMUNICATION SYSTEM

(71) Applicant: Integrated Device Technology, Inc., San Jose, CA (US)

(72) Inventors: Mohammad Shahanshah Akhter, Ottawa (CA); Brian Scott Darnell, Suwanee, GA (US); Steve Lamontagne, Ottawa (CA); Bachir Berkane, Ottawa (CA)

(73) Assignee: Integrated Device Technology Inc., San Jose, CA (US)

( * ) Notice: Subject to any disclaimer, the term of this patent is extended or adjusted under 35 U.S.C. 154(b) by 0 days.

(21) Appl. No.: 14/050,130

(22) Filed: Oct. 9, 2013

(51) Int. Cl.
*H04B 1/66* (2006.01)
*H03M 7/30* (2006.01)

(52) U.S. Cl.
CPC .......... *H03M 7/6041* (2013.01); *H03M 7/3059* (2013.01)
USPC ................. 375/240; 375/240.01; 375/240.24; 375/240.25; 375/240.26

(58) Field of Classification Search
CPC . H04N 7/50; H04N 7/26244; H04N 7/26271; H04N 7/465; H04N 9/8042; H04N 5/58; H04N 7/26313; H04N 7/26015; H04N 7/26335; H04N 7/26707; H04N 7/26946; H04N 7/26941; H04N 21/2365; H04N 21/4347; H03M 7/30
USPC .................. 375/240, 240.01, 240.24, 240.25, 375/240.26
See application file for complete search history.

(56) References Cited

U.S. PATENT DOCUMENTS

| | | |
|---|---|---|
| 5,999,561 A | 12/1999 | Naden et al. |
| 6,192,259 B1 | 2/2001 | Hayashi |
| 6,226,325 B1 * | 5/2001 | Nakamura ..................... 375/240 |
| 6,263,503 B1 | 7/2001 | Margulis |
| 6,449,596 B1 | 9/2002 | Ejima |
| 6,775,530 B2 | 8/2004 | Severson et al. |
| 6,842,623 B2 | 1/2005 | Koskal |

(Continued)

FOREIGN PATENT DOCUMENTS

WO  WO2005/048625  5/2005

OTHER PUBLICATIONS

CPRI Specification V4.1, Commmon Public Interface (CPRI); Interface Specification, Feb. 1, 2009, 75 pages.

(Continued)

*Primary Examiner* — Phuong Phu
(74) *Attorney, Agent, or Firm* — Kenneth Glass; Molly Sauter; Glass & Associates

(57) ABSTRACT

The method and apparatus of the present invention provides for the compression of signal data having a low latency jitter while maintaining a target compression ratio and reasonable degradation, as is required by next generation systems. In accordance with the present invention, a method and apparatus are provided for compressing data in a communication system by receiving uncompressed packet at a compressor of the communication system, segmenting the packet into a plurality of packet segments, calculating signal sample bit-removal information for each of the plurality of packet segments and compressing the packet segments utilizing the signal sample bit-removal information that is calculated based upon the signal characteristics of the uncompressed packet and a desired target compression ratio.

16 Claims, 13 Drawing Sheets

(56) References Cited

U.S. PATENT DOCUMENTS

| | | |
|---|---|---|
| 6,903,668 B1 | 6/2005 | Drorr et al. |
| 7,009,533 B1 | 3/2006 | Wegener |
| 7,088,276 B1 | 8/2006 | Wegener |
| 7,142,519 B2 | 11/2006 | Saadeh et al. |
| 7,541,950 B2 | 6/2009 | Wegener |
| 7,623,894 B2 | 11/2009 | Vaglica et al. |
| 7,656,897 B2 | 2/2010 | Liu |
| 7,680,149 B2 | 3/2010 | Liu et al. |
| 7,706,477 B2 | 4/2010 | Larsson |
| 7,835,435 B2 | 11/2010 | Soni et al. |
| 7,852,797 B2 | 12/2010 | Kang et al. |
| 7,899,410 B2 | 3/2011 | Rakshani et al. |
| 7,924,949 B2 | 4/2011 | Larsson |
| 7,961,807 B2 | 6/2011 | Kotecha et al. |
| 8,005,152 B2 | 8/2011 | Wegener |
| 8,018,910 B2 | 9/2011 | Jiang et al. |
| 8,054,889 B2 | 11/2011 | Isu et al. |
| 8,089,854 B2 | 1/2012 | Persico |
| 8,108,377 B2 | 1/2012 | Jiang |
| 8,174,428 B2 | 5/2012 | Wegener |
| 8,176,524 B2 | 5/2012 | Singh et al. |
| 8,239,912 B2 | 8/2012 | Deng |
| 8,340,021 B2 | 12/2012 | Okeeffe et al. |
| 2002/0055371 A1 | 5/2002 | Arnon et al. |
| 2004/0004943 A1 | 1/2004 | Kim |
| 2004/0062392 A1 | 4/2004 | Morton |
| 2004/0082365 A1 | 4/2004 | Sabach et al. |
| 2004/0198237 A1 | 10/2004 | Abutaleb et al. |
| 2005/0104753 A1 | 5/2005 | Dror et al. |
| 2005/0169411 A1 | 8/2005 | Kroeger |
| 2007/0076783 A1 | 4/2007 | Dishman et al. |
| 2007/0116046 A1 | 5/2007 | Liu et al. |
| 2007/0149135 A1 | 6/2007 | Larsson et al. |
| 2007/0160012 A1 | 7/2007 | Liu |
| 2009/0149221 A1 | 6/2009 | Liu et al. |
| 2009/0180407 A1 | 7/2009 | Sabat et al. |
| 2009/0290632 A1 | 11/2009 | Wegener |
| 2010/0067366 A1 | 3/2010 | Nicoli |
| 2010/0202311 A1 | 8/2010 | Lunttla et al. |
| 2010/0246642 A1 | 9/2010 | Walton et al. |
| 2011/0280209 A1 | 11/2011 | Wegener |
| 2012/0008696 A1 | 1/2012 | Wegener |
| 2012/0014421 A1 | 1/2012 | Wegener |
| 2012/0014422 A1 | 1/2012 | Wegener |
| 2012/0057572 A1 | 3/2012 | Evans |
| 2012/0183023 A1 | 7/2012 | Filipovic et al. |
| 2012/0202507 A1 | 8/2012 | Zhang et al. |
| 2012/0250740 A1 | 10/2012 | Ling |
| 2012/0328121 A1 | 12/2012 | Truman et al. |

OTHER PUBLICATIONS

OBSAI Open base Station Architecture Initiative BTS System Reference document Ver. 2.0, Apr. 27, 2006, 151 pages.
OBSAI Open Base Station Architecture Initiative Reference Point 3 Specification Ver. 4.0, Mar. 7, 2007, 119 pages.
K. I. Pendersen. "Frequency domain scheduling for OFMA with limited and noisy channel feedback" 2007 IEEE 66th Vehicular Technology Conference. pp. 1792-1796, Oct. 3, 2007., see section II. C.
Maruyama, S. et al., "Base Transceiver Station for W-CDMA System," Fujitsu Sci. Tech. J. 38,2, p. 167-73, Dec. 2002.

* cited by examiner

| Signal Sample # | I1 | Q1 | I2 | Q2 | I3 | Q3 | I4 | Q4 | I5 | Q5 | I6 | Q6 |
|---|---|---|---|---|---|---|---|---|---|---|---|---|
| Integer Signal Sample | 128 | 725 | 1253 | 1599 | 1688 | 1491 | 1035 | 396 | -316 | -979 | -1475 | -1717 |
| Bit-width w/o Meaningless Bits | 9 | 11 | 12 | 12 | 12 | 12 | 12 | 10 | 10 | 11 | 12 | 12 |
| Truncated # of Bits | 5 | 5 | 5 | 5 | 5 | 5 | 4 | 4 | 4 | 4 | 4 | 4 |
| Compressed Integer | 4 | 23 | 39 | 50 | 53 | 47 | 65 | 25 | -20 | -61 | -92 | -107 |
| Compressed Signal Sample | 0000100 | 0010111 | 0100111 | 0110010 | 0110101 | 0101111 | 01000001 | 00011001 | 11101100 | 11000011 | 10100100 | 10010101 |

7-bit x 6 — 1305
8-bit x 6 — 1310

1300

First Sub-Segment

| | |
|---|---|
| Largest Magnitude Integer | 1688 |
| 16-bit Binary Representation | 0000 0110 1001 1000 |
| Without Meaningless Bits | 0110 1001 1000 |
| 7-bit Compressed Binary | 0110 101 |
| 7-bit Compressed Integer | 53 |
| Number of Truncated Bits (NTB1) | 5 |

Second Sub-Segment

| | |
|---|---|
| Largest Magnitude Integer | -1717 |
| 16-bit Binary Representation | 1111 1001 0100 1011 |
| Without Meaningless Bits | 1001 0100 1011 |
| 7-bit Compressed Binary | 1001 0101 |
| 7-bit Compressed Integer | -107 |
| Number of Truncated Bits (NTB2) | 4 |

Header Fields: 4 bits to encode NTB1 and 2 bits to encode NTB2 as an increment with respect to NTB1 increments are limited to {-1, -2, 0, +2} and NTB2 is adjusted accordingly.

Fig. 13

METHOD AND APPARATUS FOR PROVIDING NEAR-ZERO JITTER REAL-TIME COMPRESSION IN A COMMUNICATION SYSTEM

BACKGROUND OF THE INVENTION

Transceiver systems in wireless communication networks perform the control functions for directing signals among communicating subscribers, or terminals, as well as communication with external networks. Transceiver systems in wireless communications networks include radio base stations and distributed antenna systems (DAS). For the reverse link, or uplink, a terminal transmits the RF signal received by the transceiver system. For the forward link, or downlink, the transceiver system transmits the RF signal to a subscriber, or terminal, in the wireless network. A terminal may be fixed or mobile wireless user equipment unit (UE) and may be a wireless device, cellular phone, personal digital assistant (PDA), personal computer or other device equipped with a wireless modem.

The rapid increase in data (e.g., video) communication and content consumption has led to expansion of wireless communication networks. As a result, the introduction of next generation communication standards (e.g., 3GPP LTE-A, IEEE 802.16m) has led to improved techniques for data processing, such as carrier aggregation (e.g., 100 MHz) with 8×8 MIMO (Multiple-Input, Multiple-Output) and CoMP (Co-Operative Multi-Point). This in turn has created the need for radio access networks capable of handling wider bandwidths and an increasing number of antennas. These radio access networks will require a higher numbers of fiber links to connect the base stations to the remote radio units. In addition, it is desirable to provide carrier aggregation with Multiple-Input and Multiple-Output (MIMO) and Co-Operative Multipoint (CoMP) techniques to significantly increase spectral efficiency. The implementation of Co-Operative Multipoint techniques requires communication between the baseband units and requires an increasing number of optical or wireless links between the baseband units and the radio units to support the increased data rate achievable with these improved transmission schemes. The increasing number of links required for these techniques results in an undesirable increased infrastructure cost.

Compression techniques can be used to reduce network infrastructure cost by reducing the number of optical or wireless links required to transmit the data as well as by optimizing resources. Typical compression techniques currently known in the art suffer from compression jitter, which translates into a latency jitter, and often introduce unacceptable signal degradation into the system. Superior compression solutions for modern communication systems require low latency, near-zero jitter and reduced signal degradation to improve the performance of the compression/decompression and a low footprint implementation to reduce the cost of the device.

Accordingly, there is a need for a method and apparatus for data compression that provides both low latency and low implementation cost for compression and decompression which also ensures near-zero jitter while maintaining a reasonable level of data signal degradation resulting from the compression.

SUMMARY OF THE INVENTION

The present invention provides a system and method for data compression in a communication system. The method includes receiving an uncompressed data segment comprising a plurality of signal samples and selecting a desired compression ratio for the uncompressed data segment. The method further includes, dividing the uncompressed data segment into a plurality of sub-segments, each of the plurality of sub-segments comprising a subset of the plurality of signal samples, determining, for each of the plurality of sub-segments, signal sample bit-removal information to achieve the desired compression ratio and removing, from each of the plurality of signal samples of each of the plurality of sub-segments, the plurality of bits identified by the signal sample bit-removal information, to generate a plurality of compressed signal samples.

In the present invention, the signal sample bit-removal information includes information for the removal of meaningless bits and information for the truncation of bits from each of the sub-segments to attain the desired compression ratio. As such, the compression method of the present invention is a multi-level bit removal process, wherein each level is associated with a sub-segment and the appropriate encoding method. With the present invention, redundant and unnecessary bits are removed without the undesirable introduction of signal degradation into the compressed data packets.

BRIEF DESCRIPTION OF DRAWINGS

FIG. 13 is a diagram illustrating an exemplary embodiment for compression of a data signal in accordance with the present invention.

DESCRIPTION OF THE INVENTION

The modular design approach for radio transceiver systems, wherein the baseband processing is separated from the radio frequency processing, has led the industry to develop interface standards. One example of a standard interface for the data transfer interfaces between the radio units and baseband units of transceiver systems is the Common Public Radio Interface (CPRI). Connection topologies between the baseband unit and one or more remote radio units include point-to-point, multiple point-to-point, chain, star, tree, ring and combinations thereof. Another example of an interface specification for modular architecture of radio transceiver systems is the Open Base Station Architecture Initiative (OBSAI). The OBSAI specification describes alternative protocols for the interconnection of baseband modules and remote radio units analogous to the CPRI specification, as well as data transfer protocols for the serial data links.

In conventional cellular communication systems, radio coverage is provided for a given geographic area via multiple base stations distributed throughout the geographic area involved. In this way, each base station can serve traffic in a smaller geographic area. Consequently, multiple base stations in a wireless communication network can simultaneously serve users in different geographic areas, which increases the overall capacity of the wireless network involved.

In order to further increase the capacity of wireless systems, each base station may be configured to support radio coverage in multiple sectors. For example, a base station in a conventional cellular system may be configured to provide radio coverage in one sector, three sectors or six sectors. In those systems employing multiple sectors per base station, each sector can handle part of the traffic in an additional smaller geographic area, which increases the overall capacity of the wireless network involved. Each of the sectors may include multiple remote radio units in communication with each of the base stations. Each of the radio units may further include multiple antennas for both receiving and transmitting data between the radio unit and the user of the communication system.

As described, communication systems are known in the art to include a baseband unit for performing signal processing in communication with a remote radio unit for receiving and transmitting signals to an antenna. The present invention provides a method and apparatus for an efficient compression solution implemented in a data compressor of a communication system.

Figure 1:
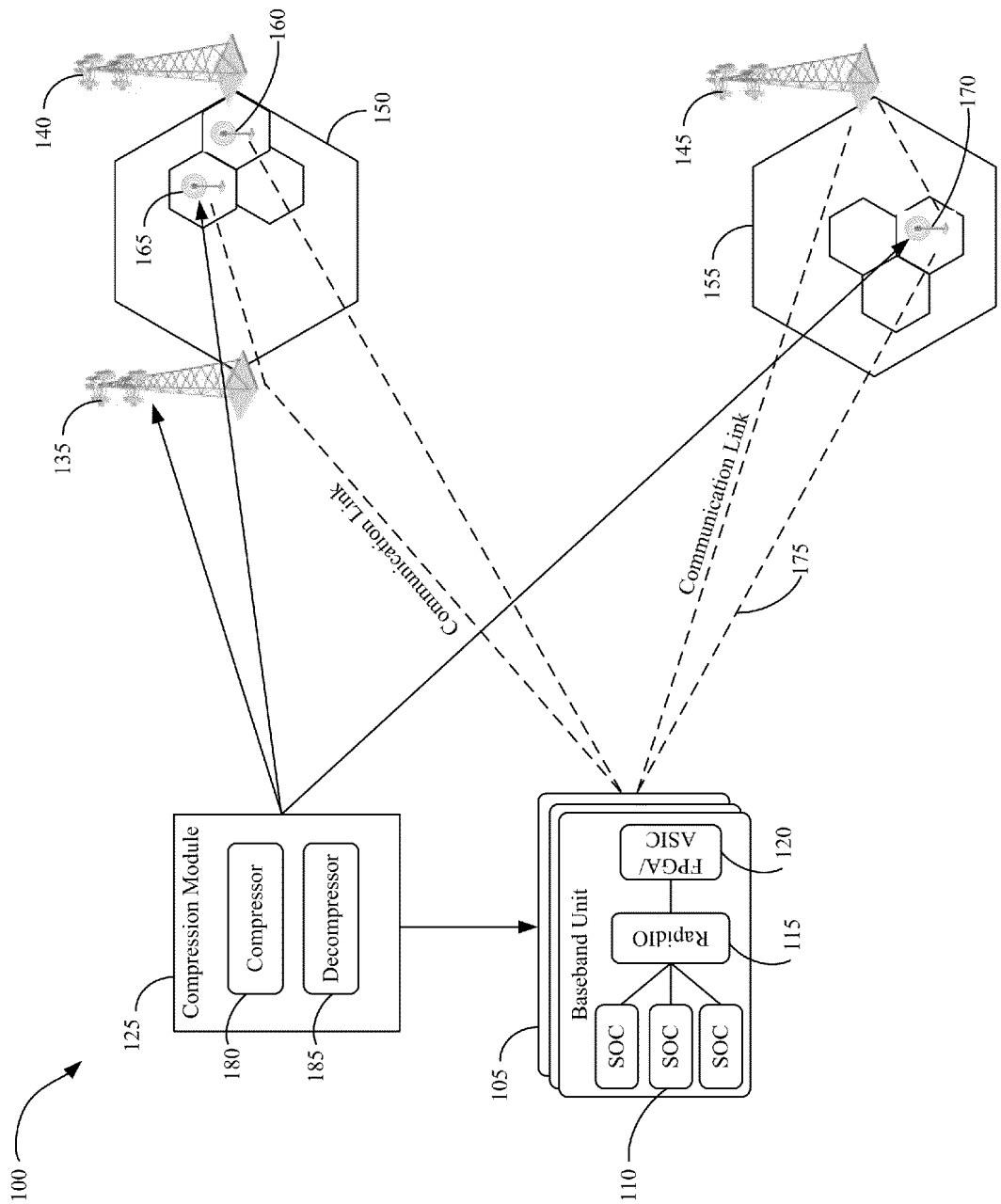
FIG. 1 is an illustration of a communication system architecture in accordance with an embodiment of the present invention.

FIG. 1 illustrates compression and decompression in a radio access network communication system 100. In centralized radio access network communication system 100, remote radio units 135, 140, 145, 160, 165, 170 may include one or more antennas that may be used to transmit radio frequency data to a user or to receive radio frequency data from a user. Each of the remote radio units is responsible for providing a communication signal within a predetermined coverage area 150, 155. In a particular embodiment, the coverage area may be defined by a macro cell with a small cell overlay. The remote radio units 135, 140, 145, 160, 165, 170 may be coupled to a baseband unit 105 and to each other through a communication link 175. The communication link 175 may be a wireless, wired or optical link. In a particular embodiment, the connection may be a wired CPRI link. The baseband unit 105 may include a plurality of baseband cards and each baseband card may further include a control processor 110 implemented in an SOC (System on a Chip) additional signal processing circuitry 120 implemented in an FPGA or ASIC and a RapidIO interface 115 between the control processor 110 and the signal processing circuitry 120. The control circuit and signal processing circuitry may perform signal processing functions to modulate communication data that were extracted from previously received wireless signals or signals received from an external network to produce digital signals. The signal processing functions depend on the modulation format and can include symbol modulation, channel coding, spreading for CDMA, diversity processing for transmission, time and frequency synchronization, upconverting, multiplexing, and inverse fast Fourier transformation for OFDM. A compression module 125 may be implemented within the baseband unit 105 and/or at one or more of the remote radio units 135, 140, 145, 160, 165, 170. The compression module 125 may include both a compressor 180 and a decompressor 185. The compression module 125 is responsible for compressing the signal samples to be transmitted over the communication link 175 and for decompressing the received signal after transmission over the communication link 175. The compressor 180 and decompressor 185 may be integrated into one circuit, or the compressor 180 and decompressor 185 may be separate circuits.

In a particular embodiment, the signal samples may be compressed at the baseband unit 105 prior to being transmitted to one or more of the remote radio units 135, 140, 145, 160, 165, 170, where the signal samples are then reconstructed. Alternatively, the signal samples are compressed at the remote radio unit 135, 140, 145, 160, 165, 170, prior to being transmitted to the baseband unit 105, where the signal samples are then reconstructed.

In the present invention, the compressor 180 is used to compress the signal samples prior to transmission over the communication link 175 to increase the data throughput of the communication system. Compressing the data prior to transmission over the wireless link also allows for a reduction in the number of antennas that are necessary to transmit the signal samples between the baseband unit 105 and the remote radio units 135, 140, 145, 160, 165, 170.

The radio units 135, 140, 145, 160, 165, 170 may be operating in the same sector or in different sectors. In operation, the radio units 135, 140, 145, 160, 165, 170 may receive data from the baseband unit 105, or from another one of the radio units 135, 140, 145, 160, 165, 170.

In a communication system operating in an uplink mode, radio frequency data is received from a user at an antenna associated with a remote radio unit 135, 140, 145, 160, 165, 170 to be transmitted to a baseband unit 105. The radio frequency data received at the remote radio unit is sampled and converted to digital data and additional data processing may be applied to the data at the radio unit 135, 140, 145, 160, 165, 170. The data is then compressed at the compression module 125 of the radio unit 135, 140, 145, 160, 165, 170 and then transmitted from the radio unit 135, 140, 145, 160, 165, 170 to the baseband unit 105 for further processing.

In a communication system operating in a downlink mode, data may be transmitted from the baseband unit 105 to a remote radio unit 135, 140, 145, 160, 165, 170 for subsequent transfer of the data to a user via an antenna in communication with the remote radio unit 135, 140, 145, 160, 165, 170. The signal samples received at the baseband unit 105 are converted to digital data and additional data processing may be applied to the signal samples at the baseband unit 105. The signal samples are then compressed at the compression module 125 of the baseband unit 105 and then transmitted from the baseband unit 105 to one or more of the remote radio units 135, 140, 145, 160, 165, 170 for further processing.

Figure 2:
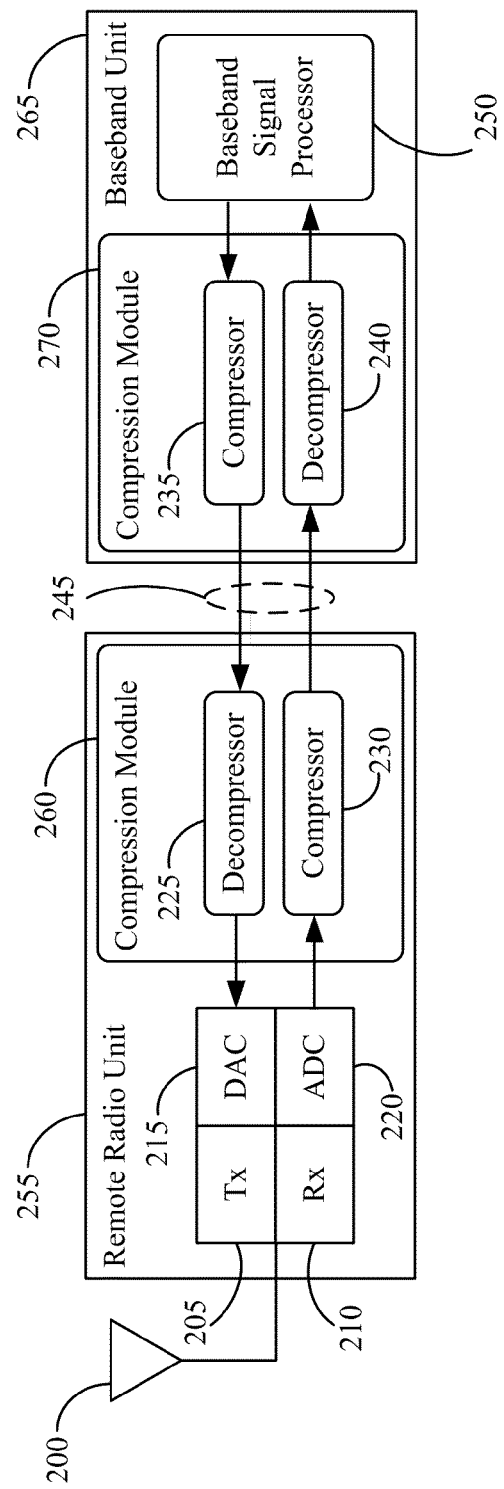
FIG. 2 is a block diagram illustrating a general base station architecture that incorporates compression and decompression in accordance with an embodiment of the present invention.

FIG. 2 is a block diagram illustrating a communication system architecture that incorporates compression and decompression. With reference to FIG. 2, the communication system architecture includes a baseband unit 265 connected by one or more serial communication links 245 to a remote radio unit 255. This general architecture can be used for any air interface standard employed by wireless communication networks, including GSM/EDGE, CDMA based modulation formats, OFDM base modulation formats such as WiMax and other signal modulation formats that may evolve. The remote radio unit 255 may be located near the antenna 200 on an antenna tower. The remote radio unit 255 may be connected to multiple antennas for transmission, reception, diversity or beamforming. The serial communication link 245 may be implemented by fiber optic, coaxial cable or RJ-45 twisted pair. The baseband unit 265 performs signal processing functions to prepare data for transmission by the remote radio unit 255 or recovers data from signal samples received from the remote radio unit 255. The signal processing functions performed by the baseband unit 254 may include symbol modulation/demodulation, channel coding/decoding, spreading/de-spreading for CDMA, diversity processing for transmission/reception, interference cancellation, equalization, time and frequency synchronization, upconverting/downconverting, multiplexing/demultiplexing and data transport to/from an external network.

For the transmit path, or downlink, the baseband signal processor 250 of the baseband unit 265 performs the signal processing functions to modulate communication data that were extracted from previously received wireless signals or received from an external network to produce digital signals. The signal processing functions depend on the modulation format and can include symbol modulation, channel coding, spreading for CDMA, diversity processing for transmission, time and frequency synchronization, upconverting, multiplexing and inverse discrete Fourier transformation for OFDM. The compressor 235 of the compression module 270 compresses the samples of the digital signal prior to transfer over a communication link 245 to the remote radio unit 255. At the remote radio unit 255, the decompressor 225 of the compression module 260 decompresses the compressed samples to reconstruct the digital signal before digital to analog conversion. The digital to analog converter (DAC) 215 of the remote radio unit 255 converts the reconstructed digital signal to an analog signal. The transmitter (Tx) 205 prepares the analog signal for transmission by the antenna 200, including up-conversion to the appropriate radio frequency, RF filtering and amplification.

For the receive path, or uplink, antenna 200 at the remote radio unit 255 receives an RF analog signal representing modulated communication data from one or more wireless sources, or subscribers. The frequency band of the received signal may be a composite of transmitted signals from multiple wireless subscribers. Depending on the air interface protocol, different subscriber signals can be assigned to certain frequency channels or multiple subscribers can be assigned to a particular frequency band. The receiver (Rx) 210 of the remote radio unit 255 performs analog operations of the RF analog signal, including RF filtering, amplification and down-conversion to shift the center frequency of the received signal. The analog to digital converter (ADC) 220 of the remote radio unit 255 converts the received analog signal to a digital signal to produce signal samples that have only real values, or alternatively, have in phase (I) and quadrature (Q) components, based upon the system design. The compressor 230 of the remote radio unit 255 applies compression to the digital signal samples before transmission over the communication link 245. At the baseband unit 265, the decompressor 240 of the compression module 270 decompresses the compressed samples to reconstruct the digital signal prior to performing the normal signal processing at the baseband signal processor 250 to recover communication data from the decompressed digital signal. The processing operations may include demodulating symbols, channel decoding, dispreading (for CDMA modulation formats), diversity processing, interference cancelling, equalizing, time and frequency synchronization, downconverting, demultiplexing, discrete Fourier transformation (for OFDM modulation formats) and transporting data derived from the decompressed signal samples to an external network.

Figure 3:
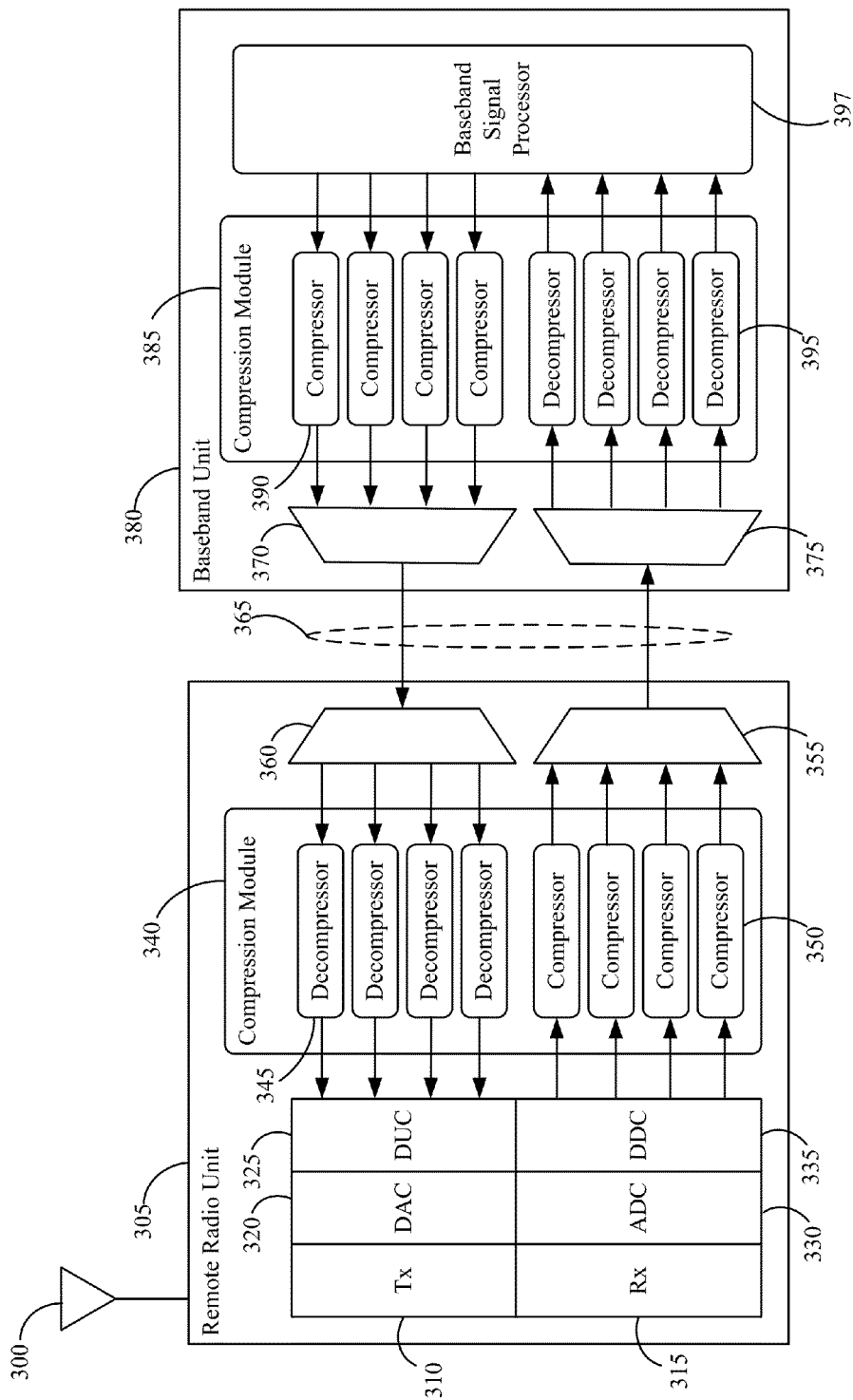
FIG. 3 is a block diagram illustrating compression and decompression where multiple signal channels are compressed and multiplexed before transfer over a communication link in accordance with an embodiment of the present invention.

FIG. 3 is a block diagram of compression and decompression in accordance with the present invention, wherein multiple signal channels are compressed and multiplexed before transfer over a communication serial data link. Both OBSAI and CPRI transceivers may receive and transmit multiple frequency channels of signal samples for each independent antenna, or multiple antenna-carriers. With reference to FIG. 3, there are four channels of signal samples representing four antenna-carriers. The signal samples comprise baseband I and Q samples. For the transmit path, each compressor 390 of the compression module 385 at the baseband unit 380 independently compresses a stream of baseband I,Q signal samples to form corresponding streams of compressed samples. The multiplexer 370 multiplexes the compressed samples into a single serial data stream for transfer over serial data communication link 365 in accordance with the standard. At the remote radio unit 305, the demultiplexer 360 demultiplexes the serial data stream to recover the four streams of compressed samples in accordance with the standard. At the remote radio unit 305, each decompressor 345 of the compression module 340 decompresses one stream of compressed samples to reconstruct the corresponding baseband I,Q signal samples. The digital upconverter (DUC) 325 of the remote radio unit 305 upconverts each stream of decompressed signal samples to respective carrier frequencies to form a channelized signal. Each upconverted digital signal may occupy a particular channel of the resulting channelized signal. The digital to analog converter (DAC) 320 of the remote radio unit 305 converts the channelized signal to an analog signal. The transmitter 310 of the remote radio unit 305 converts the analog signal to the appropriate RF frequency for transmission by the antenna 300.

Additionally, with reference to FIG. 3, for the receive path, the receiver (Rx) 315 of the remote radio unit 305 receives the RF signal and the ADC 330 digitizes the received signal to produce a digital signal that represents a channelized signal data as previously described for the transmit path. The digital down converter (DDC) 335 of the remote radio unit downconverts each channel to form corresponding streams of baseband I,Q signal samples, one for each channel. The compressors 350 of the compression module 340 compress the received signal samples to form compressed samples. The multiplexer 355 multiplexes the streams of compressed samples output from the compressors 350 to form a serial data stream in accordance with the OBSAI or CPRI standards. The serial data stream is transferred via the serial data communication link 365 to the baseband unit 380. The demultiplexer 375 at the baseband unit 380 demultiplexes the serial data to restore the four streams of compressed samples. Each decompressor 395 of the compression module 385 reconstructs the corresponding I,Q signal samples prior to performing normal operations by the baseband signal processor 397.

Figure 4:
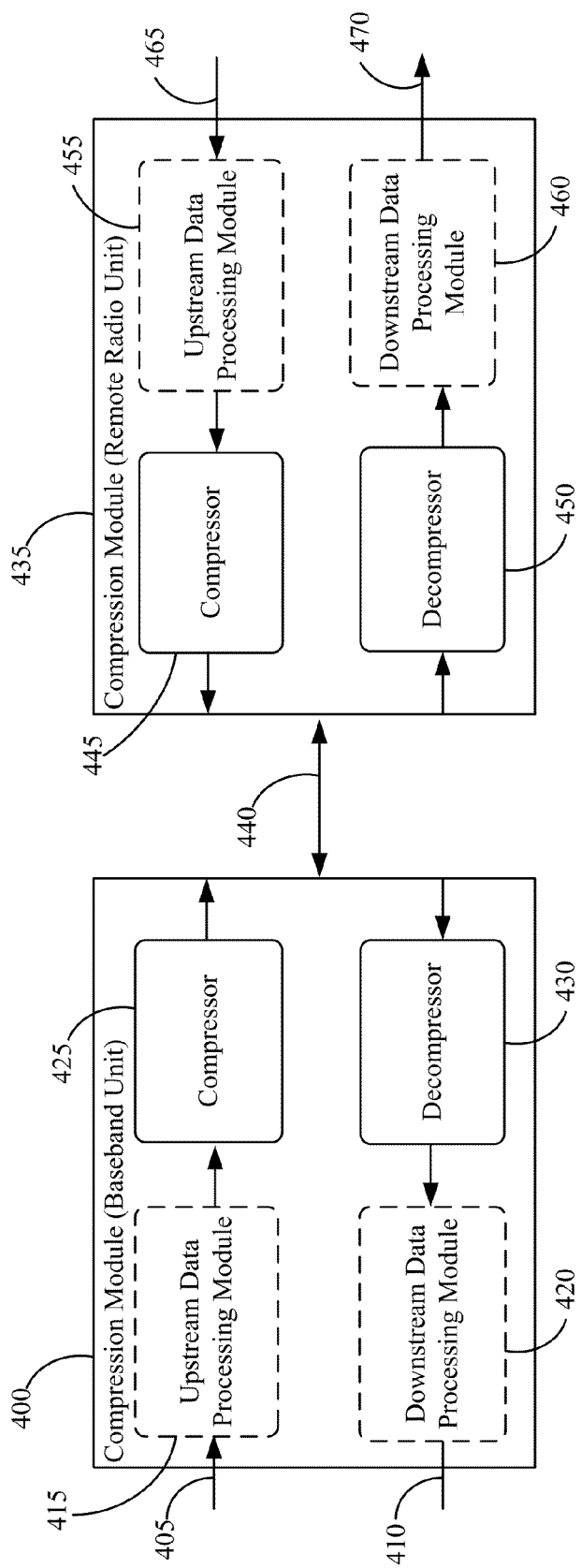
FIG. 4 is a block diagram illustrating a baseband unit and a remote radio unit accordance with an embodiment of the present invention.

With reference to FIG. 4, a compression module 400, 435 in accordance with the present invention may be implemented in an ASIC, SOC, FPGA or DSP, as previously described. The compression module may be located at the baseband unit 400 or alternatively at one or more of the remote radio units 435. In an additional embodiment, a compression module may be located at both the baseband unit 400 and at one or more of the remote radio units 435. The compression module located at the baseband unit 400 and the compression module located at the remote radio unit 435 may communicate with each over via a communication link 440. The compression module at the baseband unit 400 may include a compressor 425, a decompressor 430, an upstream data processing module 415 and a downstream processing module 420.

In a particular embodiment, the compression module 400 is located at the baseband unit. In a downlink mode of operation, signal samples 405 to be transmitted to one or more of the remote radio units may be processed at the baseband unit. The compression module 400 at the baseband unit may preprocess the signal data utilizing an upstream data processing module 415. The preprocessed data from the upstream data processing module 415 may then be transmitted to a compressor 425. The compressor 425 may then compress the signal data and transmit the compressed signal over the communication link 440 to one or more of the remote radio units. In an uplink mode of operation, compressed signal data may be received at the compression module 400 located at the baseband unit from one or more of the remote radio units 435 over the communication link 440. The compressed data may be provided to the decompressor 430 of the baseband unit. The decompressor 430 may then decompress the compressed signal data. The decompressed signal data may then be provided to a downstream data processing module 420 for additional processing prior to transmitting the decompressed signal data 410 from the compression module 400 of the baseband unit.

In the present embodiment, the compression module 400 is located at one of the remote radio units. In this embodiment, in an uplink mode of operation, signal data 465 to be transmitted to the baseband unit from one or more of the remote radio units may be received from an end user or subscriber. The compression module 435 of the remote radio unit may preprocess the signal data utilizing an upstream data processing module 455. The preprocessed data from the upstream data processing module 445 may then be transmitted to a compressor 445. The compressor 445 may then compress the signal data and transmit the compressed signal samples to the baseband unit over the communication link 440. In a downlink mode of operation, compressed signal data may be received at one or more of the remote radio units from the baseband unit over the communication link 440. The decompressor 450 of the compression module 435 at the remote radio unit may then decompress the compressed signal samples. After decompression, the decompressed signal samples may be provided to a downstream data processing module 460 for additional processing prior to transmitting the decompressed signal data 470 from the compression module of the remote radio unit 435.

Figure 5A:
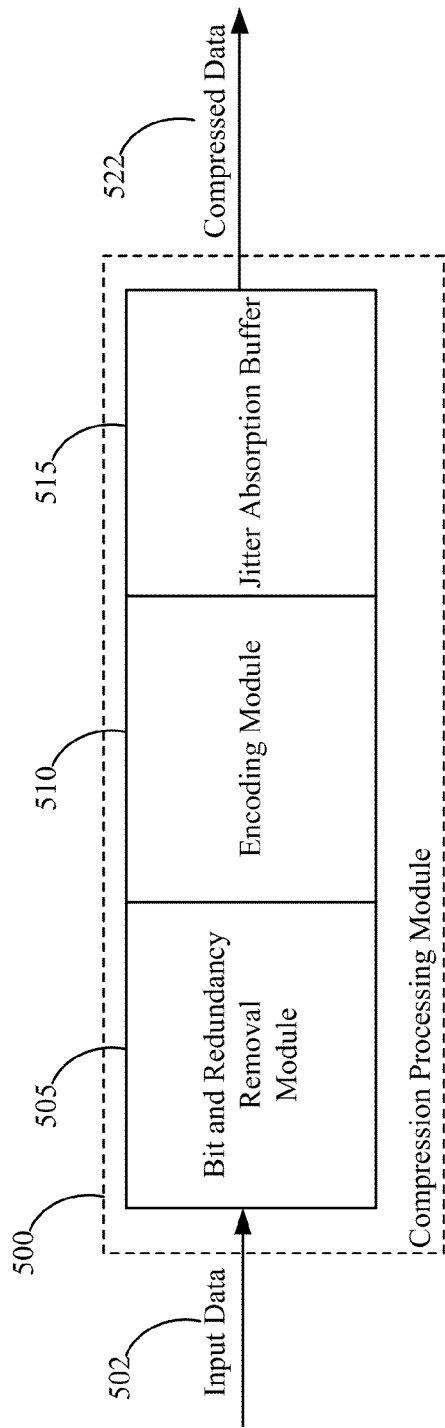
FIG. 5A is a block diagram illustrating the typical compression stages for a compressor in accordance with an embodiment of the present invention.

With reference to FIG. 5A, in performing real-time compression, the compressors 425, 445 of FIG. 4 may comprise several stages of compression within a compression processing module 500. The compression processing module 500 may include a bit and redundancy removal module 505, an encoding module 510 and a jitter absorption buffer 515. In operation, input data 502 may be received at the compression processing module 500 of the compressor. The bit and redundancy removal module 505 may process the input data 502 to increase the entropy of the data by removing redundant and unnecessary bits from the input data 502. The encoding module 510 may apply one of many encoding methods known in the art to compress the input data 502. The jitter absorption buffer 515 may be used to absorb the propagation delay variation in the data prior to transmitting the compressed data 522 from the compression processing module 500.

Figure 5B:
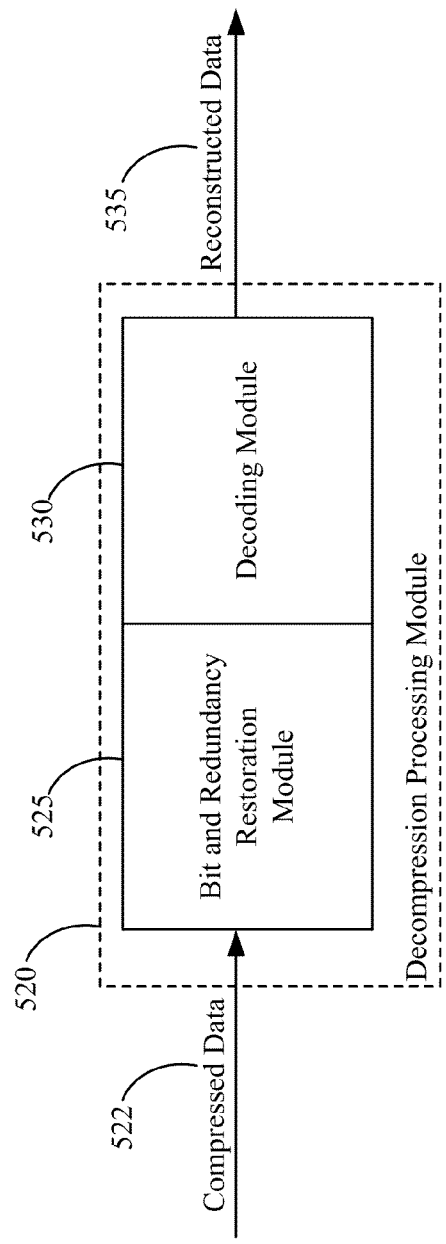
FIG. 5B is a block diagram illustrating the typical decompression stages for a decompressor in accordance with an embodiment of the present invention.

With reference to FIG. 5B, after transmission, the compressed data 522 may be received at a decompression processing module 520. The decompression processing module 520 may comprise a bit and redundancy restoration module 525 and a decoding module 530. The bit and redundancy restoration module 525 may be used to restore the bits previously removed from the data during the compression process. The decoding module 530 may be used to decode compressed data that was previously encoded by the encoding module 510 of the compression processing module 500. After the compressed data is restored and decoded, the reconstructed data 535 may be transmitted from the decompression processing module.

Compression algorithms employed in the compression processing module 500, introduce variable compression delay during compression of the signal samples. Compression jitter results from the compression process, due to the variation of entropy in the data packet. The compression jitter is undesirable, because the compression jitter translates into latency jitter within the communication system. While jitter buffers can be used to reduce the latency jitter, large jitter buffers are undesirable because they increase the footprint, and ultimately the cost of the device. Additionally, latency jitter negatively affects the attainable compression ratio and therefore, the overall performance of the compression system. As such, it is desirable to reduce the compression jitter introduced by the compressor. Additionally, compression techniques also introduce signal degradation, which is undesirable. As such, it is desirable to reduce the amount of signal degradation introduced into the signal by the compressor.

Figure 6:
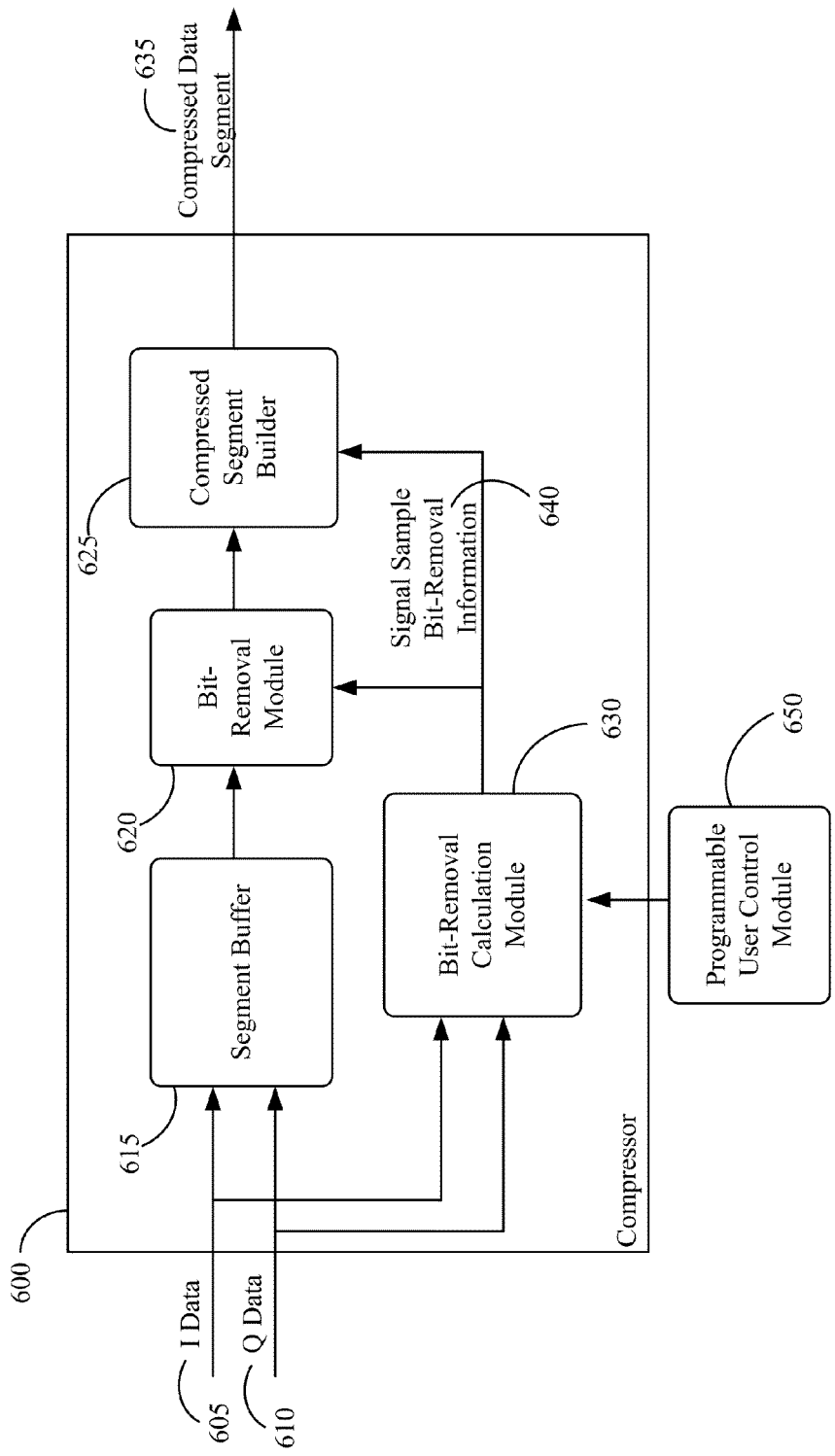
FIG. 6 is a block diagram illustrating a compressor in accordance with an embodiment of the present invention.

With reference to FIG. 6, in accordance with an embodiment of the present invention, a compressor 600 configured to compress data in a communication system includes a bit-removal calculation module 630. The bit-removal calculation module 630 is configured to receive an uncompressed data segment comprising a plurality of signal samples. The signal samples received by the bit-removal calculation module 630 may be comprised of both in-phase (I) 605 and quadrature-phase (Q) 610 signal samples and the uncompressed data segment may be received as a continuous stream or in bursts of data.

The bit-removal calculation module 630 is configured to receive the signal samples 605, 610 and to select a desired compression ratio for the uncompressed data segment. The desired compression ratio may be a previously determined, of the desired compression ratio may be provided to the bit-removal calculation module 630 by a user of the communication system through a programmable user control module 650 coupled to the bit-removal calculation module 630. In an exemplary embodiment, the desired compression ratio may be a 2:1 ratio indicating that the total number of bits in the uncompressed data segment is to be reduced by one half to achieve the desired compression ratio.

The bit-removal calculation module 630 is configured to divide the uncompressed data segment into a plurality of sub-segments, each of the plurality of sub-segments comprising a subset of the plurality of signal samples. After the bit-removal calculation module 630 has divided the uncompressed data segment into a plurality of sub-segments, the bit-removal calculation module 630 is configured to determine, for each of the plurality of sub-segments, signal sample bit-removal information 640 for each of the plurality of sub-segments to achieve the desired compression ratio. The signal sample bit-removal information 640 identifying a plurality of bits to be removed from each of the plurality of signal samples for each of the plurality of sub-segments.

The bit-removal calculation module 630 then provides the signal sample bit-removal information 640 to a bit-removal module 620 coupled to the bit-removal calculation module 630. The bit-removal module 620 is configured to receive the signal sample bit-removal information 640, and to remove the plurality of bits identified in the signal sample bit-removal information 640 from the signal samples 605, 610 to generate a plurality of compressed signal samples.

In determining the signal sample bit-removal information 640 to generate the compressed signal samples, the bit-removal calculation module 630 is further configured to determine, for each of the plurality of signal samples, a number of meaningless bits to be removed from each of the plurality of signal samples and to determine, for each of the plurality of sub-segments, a number of sub-segment truncation bits to be truncated from each of the plurality of signal samples after the number of meaningless bits have been removed. The signal sample bit-removal information 640 includes the number of meaningless bits for each of the signal samples and the number of sub-segment truncation bits for each of the plurality of sub-segments.

In determining the number of meaningless bits for each of the plurality of sub-segments, the bit-removal calculation module 630 is further configured to identify an uncompressed bit-width of the signal samples of the uncompressed segment and to determine, for each of the plurality of sub-segments, a sub-segment compressed bit-width for each of the plurality of signal samples in the sub-segment required to achieve the desired compression ratio. As such, the bit-removal calculation module 630 determines a required bit-width for each of the signal samples in each of the sub-segments that will achieve the desired compression ratio. In order to identify the meaningless bits that can be removed from each of the signal samples, the bit-removal calculation module 630 is configured to identify, for each of the plurality of signal samples, a number of leading zeros or leading ones in the binary representation of the signal sample having a bit-width equal to the uncompressed bit-width. It is known that small integer numbers have many leading zeros (in positive numbers) or ones (in negative numbers) in their binary representation. As such, when the binary representation of the signal sample is expressed with a bit-width equal to the uncompressed bit-width, the leading zeros or ones can be identified. In addition, the bit-removal calculation module 630 is configured to identify, for each of the plurality of signal samples, a sign-bit in the leading zeros or leading ones of the signal samples. To retain the proper sign of the integer when it is represented in binary form, the sign must be preserved utilizing a sign-bit, as is commonly known in the art. The bit-removal calculation module 630 is configured to identify the sign-bit within the leading zeros or leading ones and to identify, for each of the plurality of signal samples, the number of meaningless bits to be removed from each of the plurality of signal samples as equal to the number of leading zeros or leading ones, exclusive of the sign-bit and not to exceed the sub-segment compressed bit-width. As such, the bit-removal calculation module 630 of the present invention identifies the number of meaningless bits for each of the plurality of signal samples in each of the sub-segments to determine the number of meaningless bits to be included in the signal sample bit-removal information 640 provided to the bit-removal module 620 for the removal of bits from the uncompressed signal samples 605, 610.

In determining the number of sub-segment truncation bits for each of the plurality of sub-segments, the bit-removal calculation module 630 is further configured to determine, for each of the plurality of sub-segments, a sub-segment compressed bit-width for each of the plurality of signal samples in the sub-segment required to achieve the desired compression ratio and to identify, for each of the plurality of sub-segments, a largest magnitude signal sample of the plurality of signal samples. The bit-removal calculation module 630 is further configured to determine, for each of the plurality of sub-segments, a bit-width of a binary representation of the largest magnitude signal sample after the number of meaningless bits have been removed and if the bit-width of the binary representation of the largest magnitude signal sample after the number of meaningless bits have been removed is greater than the sub-segment compressed bit-width for each of the plurality of signal samples in the sub-segment required to achieve the desired compression ratio, the bit-removal calculation module 630 is configured to calculate the number of sub-segment truncation bits to be equal to the bit-width of the binary representation of the largest magnitude signal sample after the number of meaningless bits have been removed minus the sub-segment compressed bit-width for each of the plurality of signal samples in the sub-segment required to achieve the desired compression ratio. As such, the bit-removal calculation module 630 of the present invention identifies the number of truncation bits for the largest magnitude signal sample in each of the sub-segments to determine the number of truncation bits to be included in the signal sample bit-removal information 640 provided to the bit-removal module 620 for the removal of bits from the uncompressed signal samples 605, 610.

The bit-removal calculation module 630 of the present invention is configured to identify the number of bits removed from the plurality of signal samples of a first sub-segment and to calculate a difference between the number of bits removed from the plurality of signal samples of the first sub-segment and the number of bits removed from each of the plurality of signal samples of each of the other sub-segments. The bit-removal calculation module 630 is further configured to determine if the difference between the number of bits removed from the plurality of signal samples of the first sub-segment and the number of bits removed from each of the plurality of signal samples of each of the other sub-segments meets a predetermined difference and if the predetermined difference has not been met, the bit-removal calculation module 630 is configured to identify the sub-segment having a least number of bits removed from each of the plurality of signal samples and to remove an additional number of bits from each of the plurality of signal samples of the sub-segment having the least number of bits removed until the predetermined difference has been met.

The compressor 600 further includes, a compressed segment builder 625 coupled to the bit-removal calculation module 630 and the bit-removal module 620. The compressed segment builder is 625 configured to receive the signal sample bit-removal information 640 from the bit-removal calculation module 630, to encode a header comprising the signal sample bit-removal information 640 for each of the plurality of sub-segments and to generate a compressed data segment 635 comprising the plurality of compressed signal samples received from the bit-removal module 620 and the encoded header. The compressed segment builder 625 is further configured to encode the header to include the number of bits removed from the plurality of signal samples of the first sub-segment identified by bit-removal calculation module 630 and the difference between the number of bits removed from the plurality of signal samples of the first sub-segment and the number of bits removed from each of the plurality of signal samples of each of the other sub-segments determined by the bit-removal calculation module 630.

The compressor 600 further includes, a programmable user control module 650 coupled to the bit-removal calculation module 630. The programmable user control module 650 configured to receive a desired compression ratio from a user of the communication system and to provide the desired compression ratio to the bit-removal calculation module 630.

The compressor 600 further includes, a segment buffer 615 coupled to the bit-removal module 630, the segment buffer to receive an uncompressed data segment comprising a plurality of I/Q signal samples 605, 610 and to buffer the data segment.

Figure 7:
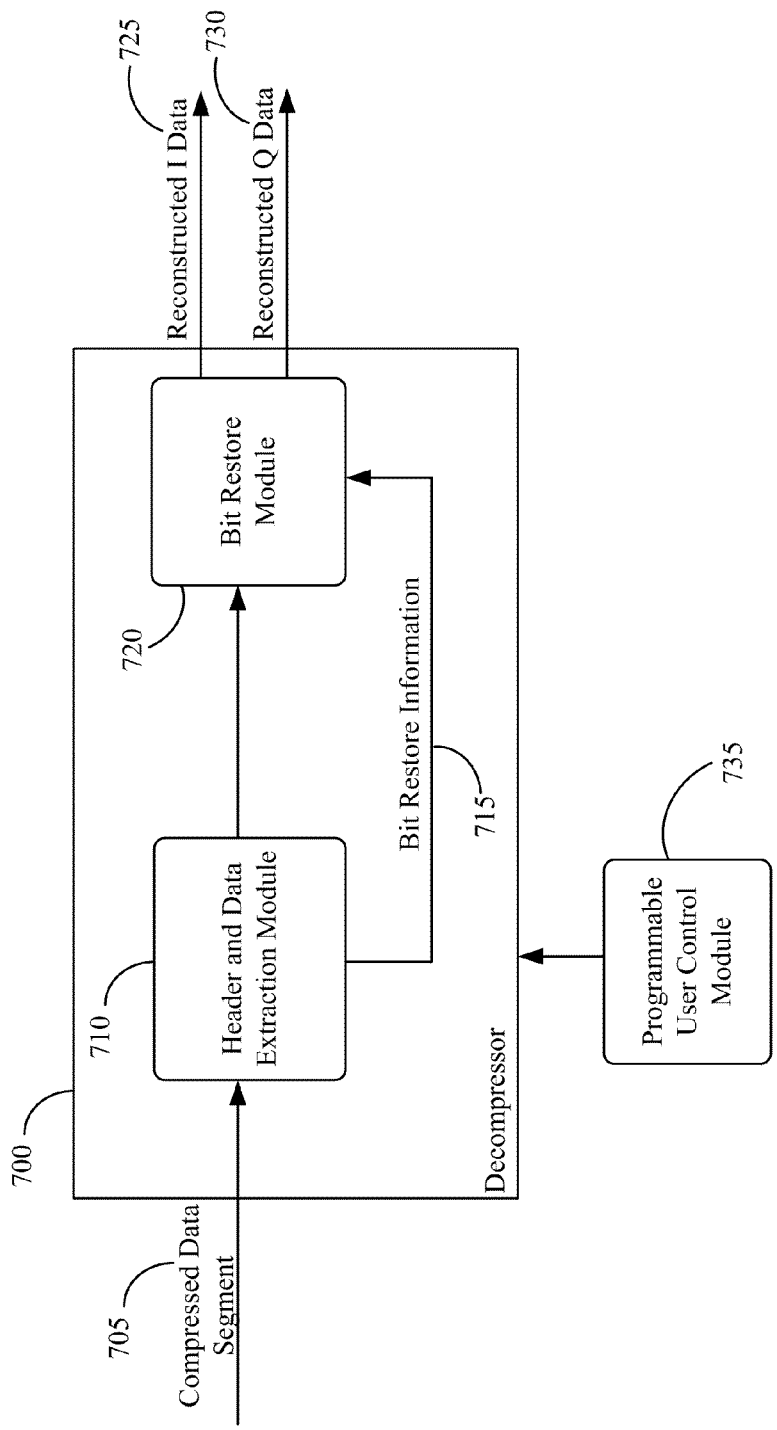
FIG. 7 is a block diagram illustrating a decompressor in accordance with an embodiment of the present invention.

In the present invention, a compression module may include a compressor and a decompressor. With reference to FIG. 7, a decompressor 700 in accordance with the present invention includes a header and data extraction module 710 and a bit restore module 720 coupled to the header and data extraction module. A programmable user control module 735 is coupled to the decompressor to communicate the details of the segmentation method used in the compressor to generate the sub-segments. The header and data extraction module 710 is configured to receive a compressed data segment 705 and to extract the header information and the compressed signal samples from the compressed data segment. Extracting the header information from the compressed data segment 705 provides the bit restore information 715 necessary to reconstruct the data segment. The bit restore information 715 and the compressed signal samples are then provided to the bit restore module 720. The bit restore module 720 is configured to use the bit restore information to decompress the compressed data segment and to reconstruct the I data 725 and Q data 730.

Figure 8:
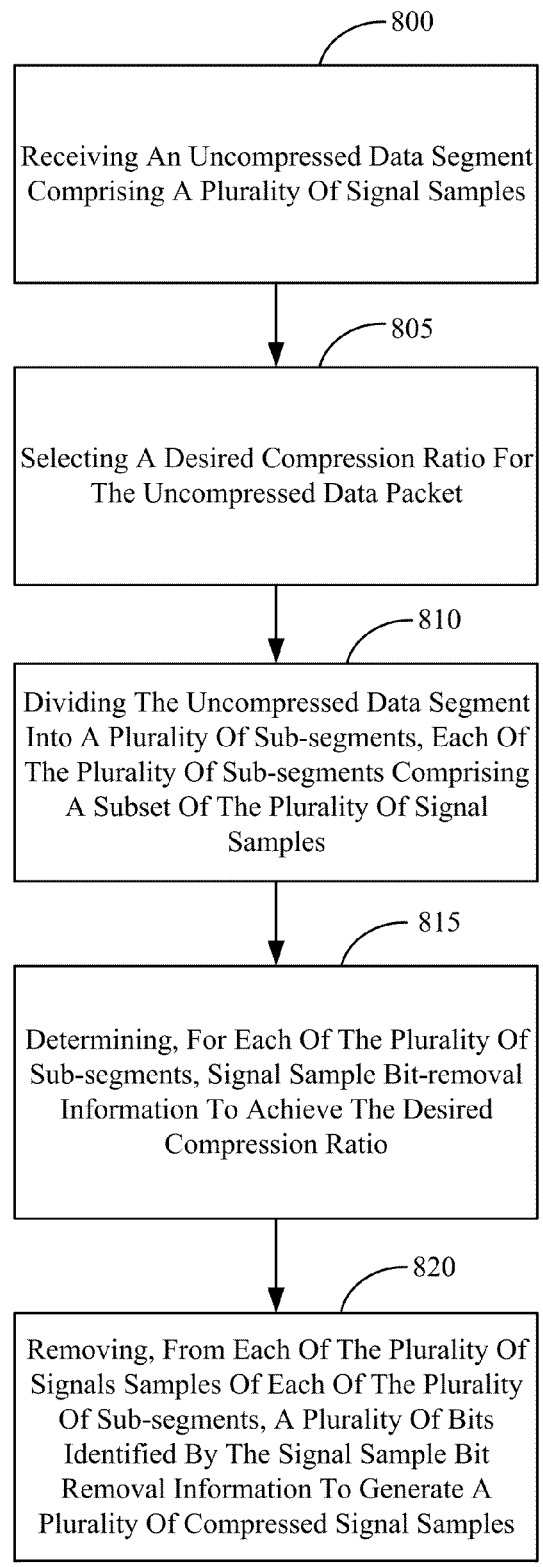
FIG. 8 is a flow diagram illustrating an embodiment of the present invention.

With reference to the flow diagram of FIG. 8, a method for data compression in a communication system in accordance with the present invention includes, receiving an uncompressed data segment comprising a plurality of signal samples 800, selecting a desired compression ratio for the uncompressed data segment 805, dividing the uncompressed data segment into a plurality of sub-segments, each of the plurality of sub-segments comprising a subset of the plurality of signal samples 810, determining, for each of the plurality of sub-segments, signal sample bit-removal information to achieve the desired compression ratio 815 and removing, from each of the plurality of signal samples of each of the plurality of sub-segments, a plurality of bits identified by the signal sample bit-removal information, to generate a plurality of compressed signal samples 820.

In one embodiment, the bit-removal calculation module 630 may perform the steps of dividing the uncompressed data segment into a plurality of sub-segments, each of the plurality of sub-segments comprising a subset of the plurality of signal samples 810, and determining, for each of the plurality of sub-segments, signal sample bit-removal information to achieve the desired compression ratio 815. In one embodiment, the plurality of sub-segments may comprise an equal number of the plurality of signal samples of the uncompressed data segment. The bit-removal module 620 may perform the step of, removing, from each of the plurality of signal samples of each of the plurality of sub-segments, a plurality of bits identified by the signal sample bit-removal information, to generate a plurality of compressed signal samples 820.

The step of selecting a desired compression ratio for the uncompressed data segment 805 may further include, receiving a desired compression ratio from a user of the communication system. The programmable user control module 650 may be used to provide the desired compression ratio to the bit-removal calculation module 630.

In determining, for each of the plurality of sub-segments, signal sample bit-removal information to achieve the desired compression ratio 815, the method may further include, determining, for each of the plurality of signal samples, a number of meaningless bits to be removed from each of the plurality of signal samples.

Figure 9:
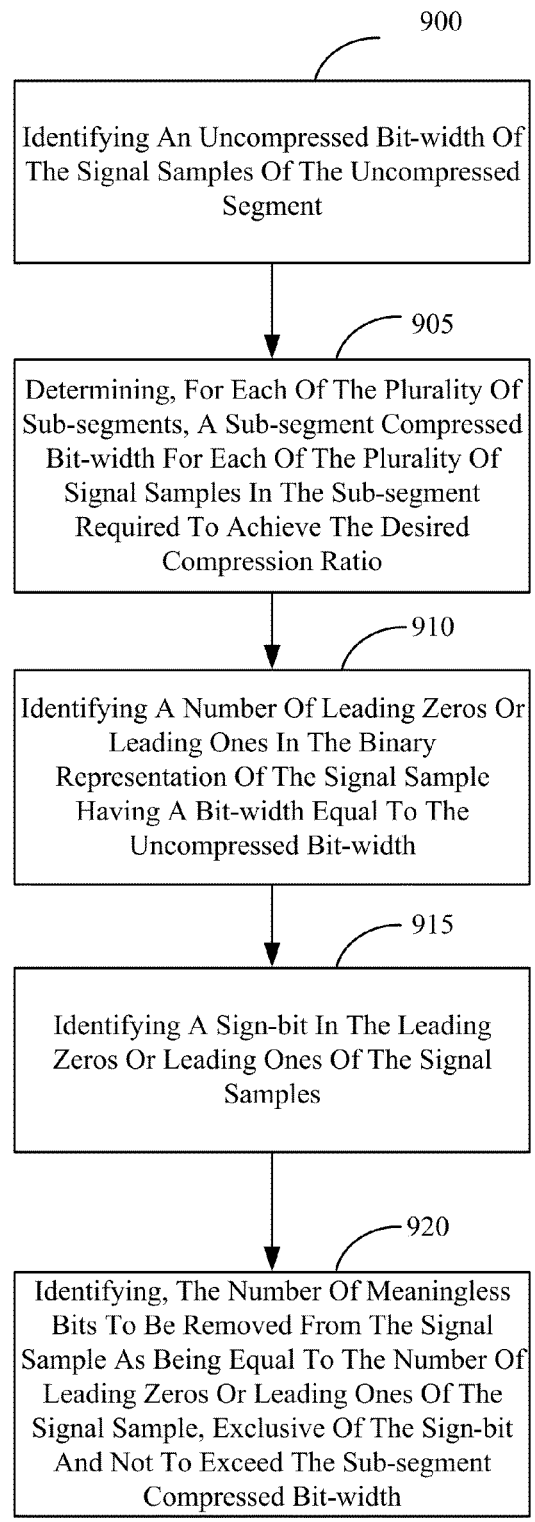
FIG. 9 is a flow diagram illustrating an embodiment of the present invention.

With reference to FIG. 9, in determining, for each of the plurality of signal samples, a number of meaningless bits to be removed from each of the plurality of signal samples, the method may further include, identifying an uncompressed bit-width of the signal samples of the uncompressed segment 900 and determining, for each of the plurality of sub-segments, a sub-segment compressed bit-width for each of the plurality of signal samples in the sub-segment required to achieve the desired compression ratio 905. The method may further include, identifying a number of leading zeros or leading ones in the binary representation of the signal sample having a bit-width equal to the uncompressed bit-width 910 and identifying a sign-bit in the leading zeros or leading ones of the signal samples 915. After the leading zeros or leading ones and the sign-bit of the signal samples have been determined, the method then proceeds by identifying, the number of meaningless bits to be removed from the signal sample as being equal to the number of leading zeros or leading ones of the signal sample, exclusive of the sign-bit and not to exceed the sub-segment compressed bit-width 920.

In determining, for each of the plurality of sub-segments, signal sample bit-removal information to achieve the desired compression ratio 815, the method may further include, determining, for each of the plurality of sub-segments, a number of sub-segment truncation bits to be truncated from each of the plurality of signal samples, after the number of meaningless bits have been removed.

Figure 10:
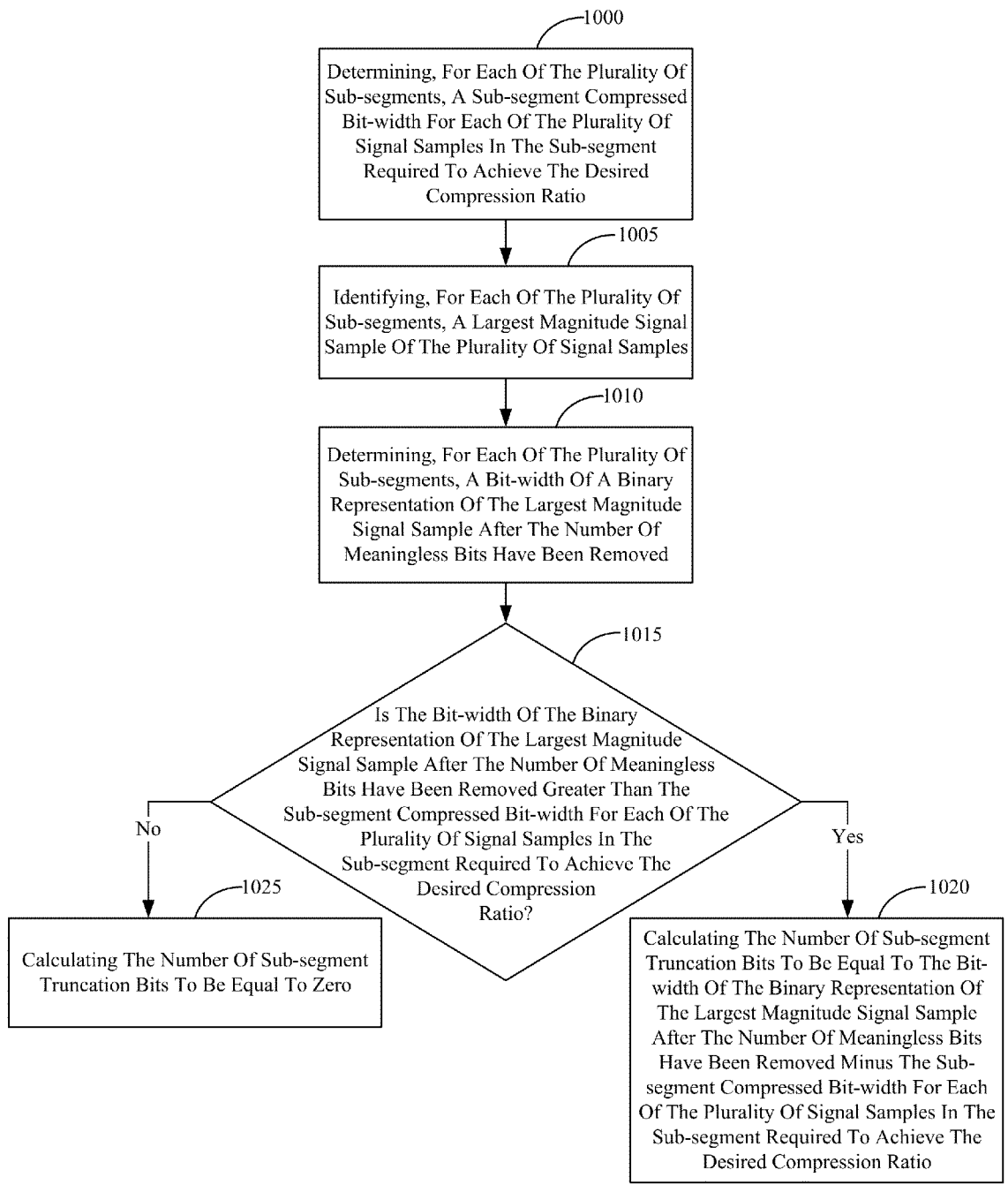
FIG. 10 is a flow diagram illustrating an embodiment of the present invention.

With reference to FIG. 10, in determining, for each of the plurality of sub-segments, a number of sub-segment truncation bits to be truncated from each of the plurality of signal samples after the number of meaningless bits have been removed, the method further comprises determining, for each of the plurality of sub-segments, a sub-segment compressed bit-width for each of the plurality of signal samples in the sub-segment required to achieve the desired compression ratio 1000 and identifying, for each of the plurality of sub-segments, a largest magnitude signal sample of the plurality of signal samples 1005. The method further includes, determining, for each of the plurality of sub-segments, a bit-width of a binary representation of the largest magnitude signal sample after the number of meaningless bits have been removed 1010 and if the bit-width of the binary representation of the largest magnitude signal sample after the number of meaningless bits have been removed is greater than the sub-segment compressed bit-width for each of the plurality of signal samples in the sub-segment required to achieve the desired compression ratio 1015, then calculating the number of sub-segment truncation bits to be equal to the bit-width of the binary representation of the largest magnitude signal sample after the number of meaningless bits have been removed minus the sub-segment compressed bit-width for each of the plurality of signal samples in the sub-segment required to achieve the desired compression ratio 1020. Alternatively, if the bit-width of the binary representation of the largest magnitude signal sample after the number of meaningless bits have been removed is less than or equal to the sub-segment compressed bit-width for each of the plurality of signal samples in the sub-segment required to achieve the desired compression ratio 1015, then calculating the number of sub-segment truncation bits to be equal zero 1025.

After the signal sample bit-removal information has been determined by the bit-removal calculation module 630 and the compressed signal samples have been formed by the bit-removal module 620, the method of the present invention includes, encoding a header comprising the signal sample bit-removal information for each of the plurality of sub-segments and generating a compressed data segment comprising the plurality of compressed signal samples and the encoded header. In one embodiment, the compressed segment builder 625 may perform the steps of encoding a header comprising the signal sample bit-removal information for each of the plurality of sub-segments and generating a compressed data segment comprising the plurality of compressed signal samples and the encoded header. Encoding the header may further include, encoding the header to include the number of bits removed from the plurality of signal samples of a first sub-segment and the difference between the number of bits removed from the plurality of signal samples of the first sub-segment and the number of bits removed from each of the plurality of signal samples of each of the other sub-segments.

After performing the step of removing, from each of the plurality of signal samples of each of the plurality of sub-segments, the plurality of bits identified by the signal sample bit-removal information, to generate a plurality of compressed signal samples 820, the method may further include identifying the number of bits removed from the plurality of signal samples of a first sub-segment, calculating a difference between the number of bits removed from the plurality of signal samples of the first sub-segment and the number of bits removed from each of the plurality of signal samples of each of the other sub-segments, determining if the difference between the number of bits removed from the plurality of signal samples of the first sub-segment and the number of bits removed from each of the plurality of signal samples of each of the other sub-segments meets a predetermined difference and if the predetermined difference has not been met, identifying the sub-segment having a least number of bits removed from each of the plurality of signal samples and removing an additional number of bits from each of the plurality of signal samples of the sub-segment having the least number of bits removed until the predetermined difference has been met.

Figure 11:
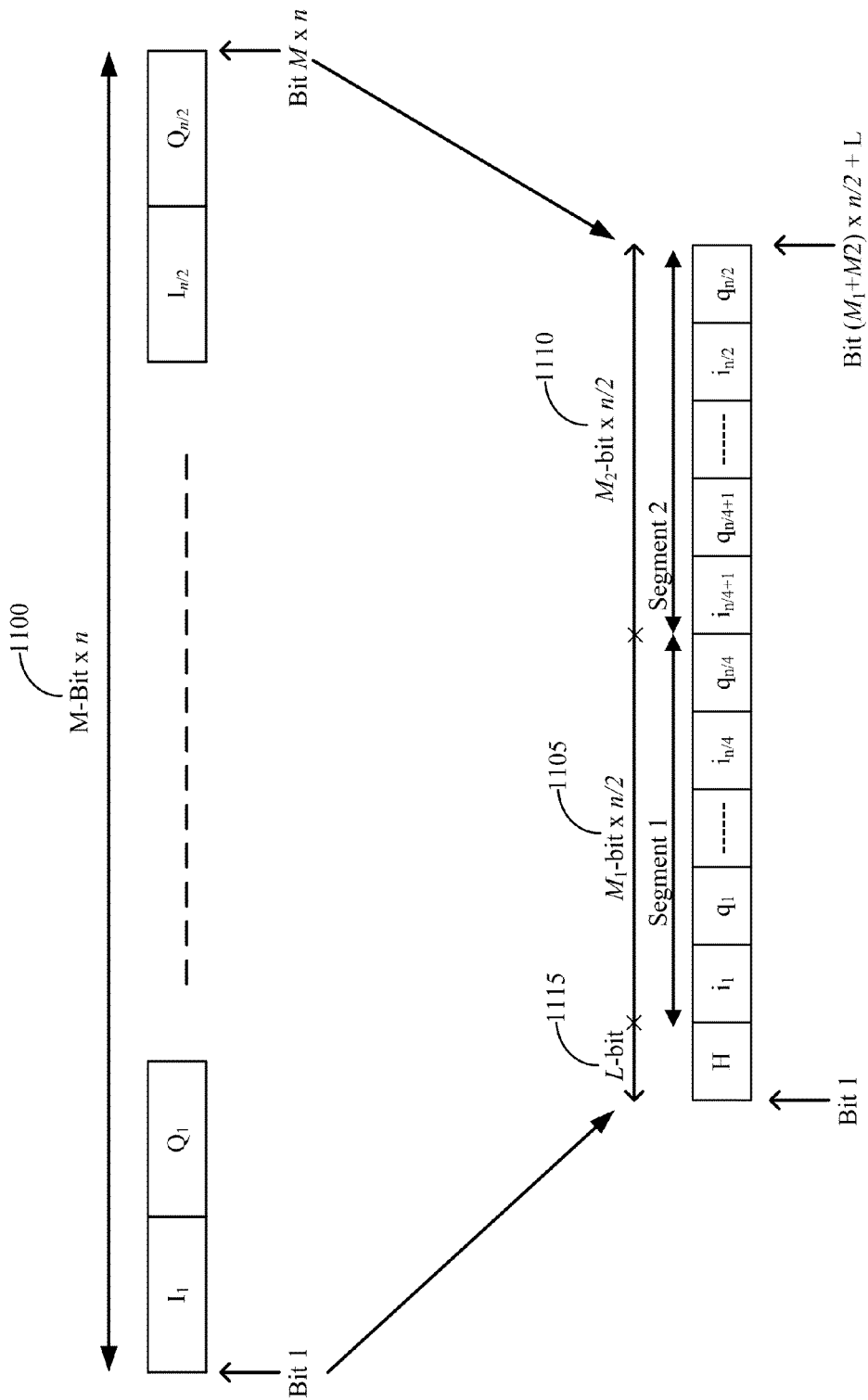
FIG. 11 is a diagram illustrating a segmentation method in accordance with an embodiment of the present invention.

The bit-removal calculation module 630 may use various methods to divide the uncompressed data segment into a plurality of sub-segments. With reference to FIG. 11, an exemplary method of dividing the uncompressed data segment into a plurality of sub-segments is illustrated. In the illustrated method, an M-Bit×n uncompressed data segment 1100, comprising n/2 I signal samples and n/2 Q signal samples. Prior to the bit-removal calculation module 630 calculating the signal sample bit-removal information, the uncompressed data segment 1100 is segmented into two sub-segments, where M is the bit-width of each of the uncompressed signal samples and n is the even number of signal samples in the uncompressed data segment. In the illustrated segmentation method of FIG. 11, the first sub-segment 1105 comprises $M_1$-bit×n/2 signal samples and the second sub-segment 1110 comprises $M_2$-bit×n/2 signal samples. As such, the compressed data segment generated by the compressed segment builder 625 includes the $M_1$-bit×n/2 signal samples of the first sub-segment and the $M_2$-bit×n/2 signal samples of the second sub-segment comprises, in addition to the L-bit header 1115.

In an exemplary embodiment of the present invention, it is assumed that the segment length (n) of the uncompressed data segment is equal to 12 and that there are 6 (n/2) I signal samples and 6 (n/2) Q signal samples included in the uncompressed data segment. Each of the uncompressed signal samples is assumed to have a bit-width of 16. As such, the bit-length of the uncompressed data segment is equal to 192 bits (12*16). The uncompressed data segment will be divided into two sub-segments, each sub-segment comprising 6 signal samples (I's and Q's). The bit-length of the signal samples in first sub-segment will be M1 and the bit-length of the signal samples in the second sub-segment will be M2. As such, the compressor of the present invention is configured to compress the M×n bit uncompressed data segment into (M1+M2)*n/2+L bits, where M1, M2<M. The L bits are used to encode the header information.

The desired compression ratio for the uncompressed data segment is assumed to be 2:1 and the number of bits to encode the header is assumed to be 6. To achieve the 2:1 compression ratio, the bit-length of the uncompressed data segment (192) must be reduced by ½, and as such, 96 bits must be removed from the uncompressed data segment. To remove 96 bits, the compressed bit-width of the first sub-segment (M1) is set to 7 and the compressed bit-width of the second sub-segment (M2) is set to 8, such that (M1+M2)*n/2+L=96.

Figure 12:
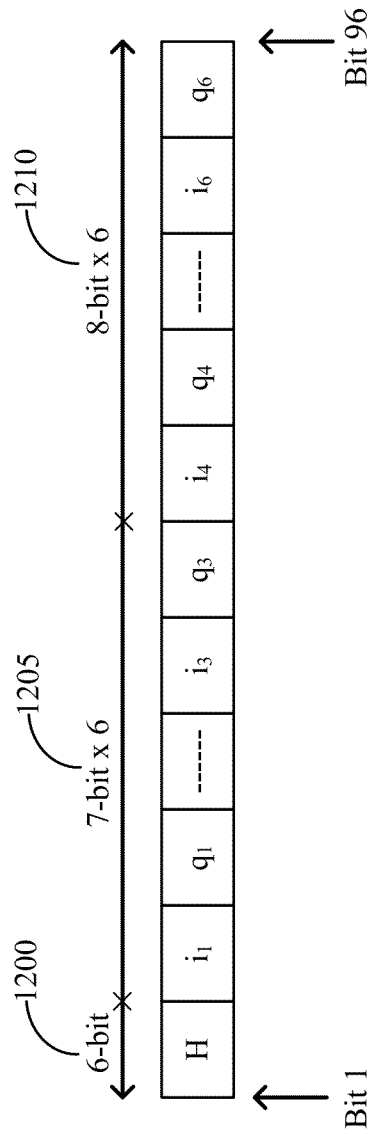
FIG. 12 is a diagram illustrating a segmentation method in accordance with an exemplary embodiment of the present invention.

With reference to FIG. 12, the segmentation performed by the bit-removal calculation module 630 for the exemplary embodiment of the uncompressed data segment is illustrated in which the header (H) 1200 comprises 6-bits, the first sub-segment 1205 comprises 6 signal samples, each signal sample having a bit-width of 7 (M1), and the second sub-segment 1210 comprises 6 signal samples, each signal sample having a bit-width of 8 (M2).

With reference to FIG. 13, an exemplary uncompressed data segment 1300 and the values of the signal samples comprising the uncompressed data segment 1300 are illustrated. In the exemplary embodiment, after dividing the uncompressed data segment into two sub-segments, the bit-removal calculation module 630 determines, for each of the sub-segments, the bit-removal information 640 required to achieve the desired compression ratio of 2:1. The bit-removal calculation module 630 identifies the largest magnitude signal sample for each of the sub-segments in the uncompressed data segment 1300. In the illustrated embodiment, the largest magnitude signal sample for the first sub-segment is signal sample I3 1305, which has a magnitude of 1688, and the largest magnitude signal sample for the second sub-segment is signal sample Q6 1310, which has a magnitude of 1717. Following the identification of the largest magnitude signal sample for each sub-segment, the bit-removal calculation module 630 determines the signal sample bit-removal information 640 for each of the sub-segments required to attain the 2:1 compression ratio. As previously described, the compressed bit-width of the signal samples of the first sub-segment will be equal to 7 and the compressed bit-width of the signal samples of the second sub-segment will be equal to 8. As such, the bit-removal calculation module 630 must determine the signal sample bit-removal information 640 that will reduce each of the signal samples in the first sub-segment by 9 bits and each of the signal samples in the second sub-segment by 8 bits. The signal sample bit-removal information 640 identifies a number of meaningless bits for each signal sample and a number of sub-segment truncation bits for each signal sample.

The bit-removal calculation module 630 determines the meaningless bits for each of the signal samples. As such, for the largest magnitude signal sample, I3, of the first sub-segment:

Signed Integer                        1688

16-bit Binary Representation     0<u>000</u> 0110 1001 1000

↗  Leading

Sign-Bit     Zeroes

The sign-bit for the signal sample is the most significant bit, in this case, a zero. The next 4 zeros are considered leading zeros and as such, are meaningless bits in the signal sample. The bit-removal calculation module 630 removes the meaningless bits from the largest magnitude signal sample, while retaining the sign-bit. If the number of meaningless bits in the largest magnitude signal sample is greater than the compressed bit-width, the bit-removal calculation module 630 will only remove the number of meaningless bits up to the compressed bit-width. As such, the largest magnitude signal of the first sub-segment, I3, after the 4 meaningless bits have been removed has a bit-width of 12 bits and is represented as:

I3 with Meaningless Bits Removed 0110 1001 1000

Following the removal of the meaningless bits from the largest magnitude signal sample, I3, the bit-removal calculation module 630 determines a number of sub-segment truncation bits to be truncated from the largest magnitude signal sample of the first sub-segment. In determining the sub-segment truncation bits for the first sub-segment, the bit-removal calculation module 630 determines whether or not the bit-width of the largest magnitude signal sample after the meaningless bits have been removed is greater than the compressed bit-width for the first sub-segment. Then, if the bit-width of the largest magnitude signal sample after the meaningless bits have been removed is greater than the compressed bit-width for the first sub-segment, then the number of bits equal to the difference between the bit-width of the largest magnitude signal sample after the meaningless bits have been removed and the compressed bit-width for the first sub-segment are truncated from the binary representation of the largest magnitude signal sample.

In the present example, the bit-width of the largest magnitude signal sample after the meaningless bits have been removed is equal to 12 and the compressed bit-width for the first sub-segment is equal to 7. As such, the number of sub-segment truncation bits for the first sub-segment is 5 bits (12−7), and 5 bits are truncated from the binary representation of the largest magnitude signal sample after the meaningless bits have been removed, resulting in a 7-bit compressed signal sample for I3:

7-bit compressed I3—truncate/round 0110 101

7-bit I3—integer 53

As shown in the exemplary embodiment, when the bits are truncated from the largest magnitude signal sample, it is necessary to account for rounding of the remaining least significant digit. In the present invention, the least significant digit is rounded up to a "1" if digit truncated next to the least significant digit is a "1". However, various rounding methods for binary numbers are known in the art and may be substituted for the rounding method of the exemplary embodiment.

Following the determination of the number of meaningless bits for each of the signal samples of the first sub-segment and the number of sub-segment truncation bits for the first sub-segment, the bit-removal calculation module 630 removes the number of meaningless bits and the number of sub-segment truncation bits from the binary representation of each of the signal samples of the first sub-segment to generate the plurality of compressed signal samples.

Following the same procedure for the second sub-segment, bit-removal calculation module 630 identifies the largest magnitude signal sample 1310 (−1717) having a 16-bit binary representation of 1111 1001 0100 1011 and determines the number of meaningless bits for the second sub-segment to be equal to 5 and the number of sub-segment truncation bits for the second sub-segment to be equal to 4. As such, the largest magnitude signal sample (−1717) of the second sub-segment is compressed to an 8-bit binary representation of 1001 0101, which is equivalent to an integer value of −107. The bit-removal calculation module 630 provides the signal sample bit removal information to the bit-removal calculation module 630 which then removes the number of meaningless bits and the number of sub-segment truncation bits from the binary representation of each of the signal samples of the second sub-segment to generate the plurality of compressed signal samples.

The plurality of compressed signal samples and the number of sub-segment truncation bits of the first sub-segment and the second sub-segment are then provided to the compressed segment builder 625. In the exemplary embodiment, the compressed segment builder 625 is configured to encode the header bits utilizing 6-bit differential encoding in which the number of sub-segment truncation bits of the first sub-segment is encoded using 4 bits and the difference between the number of sub-segment truncation bits of the second sub-segment and the number of sub-segment truncation bits of the first sub-segment is encoded using 2 bits. In the exemplary embodiment, the number of truncation bits of the first sub-segment is equal to 5, the number of truncation bits of the second sub-segment is equal to 4, and the difference is −1. As such, the compressed segment builder 625 encodes "5" using 4 bits as 0101 and encodes "−1" using 2 bits as 01. The compressed segment builder 625 then generates a compressed data segment comprising the plurality of compressed signal samples and the encoded header.

In alternative embodiments of the present invention, more than two segments may be identified in the segmentation of the uncompressed data and the meaningless bits and truncated bits may be fractional data bits.

The compressor of the present invention may be used in the generation of compressed data packets for transmission within a communication system. In the present invention, the packet is segmented into packet segments and signal sample bit-removal information is identified for the various packet segments to achieve a desired compression ratio. With the present invention, redundant and unnecessary bits are removed without the undesirable introduction of signal degradation into the compressed data packets.

As is known in the art, the compressor may be implemented in a Field Programmable Gate Array (FPGA), an Application-Specific Integrated Circuit (ASIC) or a variety of other commonly known integrated circuit devices. The implementation of the invention may include both hardware and software components.

We claim:

1. A method for data compression in a communication system, the method comprising:
    receiving an uncompressed data segment comprising a plurality of signal samples;
    selecting a desired compression ratio for the uncompressed data segment, the selecting a desired compression ratio for the uncompressed data segment including receiving a desired compression ratio from a user of the communication system;

17 dividing the uncompressed data segment into a plurality of sub-segments, each of the plurality of sub-segments comprising a subset of the plurality of signal samples;

determining, for each of the plurality of sub-segments, signal sample bit-removal information to achieve the desired compression ratio; and removing, from each of the plurality of signal samples of each of the plurality of sub-segments, the plurality of bits identified by the signal sample bit-removal information, to generate a plurality of compressed signal samples.

2. The method of claim 1, wherein determining, for each of the plurality of sub-segments, signal sample bit-removal information to achieve the desired compression ratio further comprises:

determining, for each of the plurality of signal samples, a number of meaningless bits to be removed from each of the plurality of signal samples;

determining, for each of the plurality of sub-segments, a number of sub-segment truncation bits to be truncated from each of the plurality of signal samples after the number of meaningless bits have been removed; and determining signal sample bit-removal information to achieve the desired compression ratio, the signal sample bit-removal information including the number of meaningless bits for each of the signal samples and the number of sub-segment truncation bits for each of the plurality of sub-segments.

3. The method of claim 1, further comprising:

encoding a header comprising the signal sample bit-removal information for each of the plurality of sub-segments; and generating a compressed data segment comprising the plurality of compressed signal samples and the encoded header.

4. The method of claim 2, wherein determining, for each of the plurality of signal samples, a number of meaningless bits to be removed from each of the plurality of signal samples further comprises:

identifying an uncompressed bit-width of the signal samples of the uncompressed segment;

determining, for each of the plurality of sub-segments, a sub-segment compressed bit-width for each of the plurality of signal samples in the sub-segment required to achieve the desired compression ratio;

identifying, for each of the plurality of signal samples, a number of leading zeros or leading ones in the binary representation of the signal sample having a bit-width equal to the uncompressed bit-width;

identifying, for each of the plurality of signal samples, a sign-bit in the leading zeros or leading ones of the signal sample; and identifying, for each of the plurality of signal samples, the number of meaningless bits to be removed from each of the plurality of signal samples of the signal sample as equal to the number of leading zeros or leading ones, exclusive of the sign-bit and not to exceed the sub-segment compressed bit-width.

5. The method of claim 2, wherein determining, for each of the plurality of sub-segments, a number of sub-segment truncation bits to be truncated from each of the plurality of signal samples after the number of meaningless bits have been removed further comprises:

determining, for each of the plurality of sub-segments, a sub-segment compressed bit-width for each of the plurality of signal samples in the sub-segment required to achieve the desired compression ratio;

18 identifying, for each of the plurality of sub-segments, a largest magnitude signal sample of the plurality of signal samples;

determining, for each of the plurality of sub-segments, a bit-width of a binary representation of the largest magnitude signal sample after the number of meaningless bits have been removed; and if the bit-width of the binary representation of the largest magnitude signal sample after the number of meaningless bits have been removed is greater than the sub-segment compressed bit-width for each of the plurality of signal samples in the sub-segment required to achieve the desired compression ratio, then calculating the number of sub-segment truncation bits to be equal to the bit-width of the binary representation of the largest magnitude signal sample after the number of meaningless bits have been removed minus the sub-segment compressed bit-width for each of the plurality of signal samples in the sub-segment required to achieve the desired compression ratio.

6. The method of claim 1, further comprising, after removing, from each of the plurality of signal samples of each of the plurality of sub-segments, the plurality of bits identified by the signal sample bit-removal information, to generate a plurality of compressed signal samples:

identifying the number of bits removed from the plurality of signal samples of a first sub-segment;

calculating a difference between the number of bits removed from the plurality of signal samples of the first sub-segment and the number of bits removed from each of the plurality of signal samples of each of the other sub-segments;

determining if the difference between the number of bits removed from the plurality of signal samples of the first sub-segment and the number of bits removed from each of the plurality of signal samples of each of the other sub-segments meets a predetermined difference; and if the predetermined difference has not been met, identifying the sub-segment having a least number of bits removed from each of the plurality of signal samples and removing an additional number of bits from each of the plurality of signal samples of the sub-segment having the least number of bits removed until the predetermined difference has been met.

7. The method of claim 3, wherein encoding a header comprising the signal sample bit-removal information further comprises, encoding the header to include the number of bits removed from the plurality of signal samples of a first sub-segment and the difference between the number of bits removed from the plurality of signal samples of the first sub-segment and the number of bits removed from each of the plurality of signal samples of each of the other sub-segments.

8. The method of claim 1, wherein each of the plurality of sub-segments comprises an equal number of the plurality of signal samples.

9. A compressor configured to compress data in a communication system, the compressor comprising:

a bit-removal calculation module configured to receive an uncompressed data segment comprising a plurality of signal samples, to select a desired compression ratio for the uncompressed data segment, to divide the uncompressed data segment into a plurality of sub-segments, each of the plurality of sub-segments comprising a subset of the plurality of signal samples, to identify an uncompressed bit-width of the signal samples of the uncompressed segment, to determine, for each of the plurality of sub-segments, a sub-segment compressed bit-width for each of the plurality of signal samples in the sub-segment required to achieve the desired compression ratio, to identify, for each of the plurality of signal samples, a number of leading zeros or leading ones in the binary representation of the signal sample having a bit-width equal to the uncompressed bit-width, to identify, for each of the plurality of signal samples, a sign-bit in the leading zeros or leading ones of the signal sample and to identify, for each of the plurality of signal samples, a number of meaningless bits to be removed from each of the plurality of signal samples that is equal to the number of leading zeros or leading ones of the signal sample, exclusive of the sign-bit and not to exceed the sub-segment compressed bit-width, to determine, for each of the plurality of sub-segments, a number of sub-segment truncation bits to be truncated from each of the plurality of signal samples after the number of meaningless bits have been removed and to determine signal sample bit-removal information that includes the number of meaningless bits and the number of sub-segment truncation bits; and a bit-removal module coupled to the bit-removal calculation module, the bit-removal module configured to receive the signal sample bit-removal information and to remove the plurality of bits identified in the signal sample bit-removal information to generate a plurality of compressed signal samples.

10. A compressor configured to compress data in a communication system, the compressor comprising:

a bit-removal calculation module configured to receive an uncompressed data segment comprising a plurality of signal samples, to select a desired compression ratio for the uncompressed data segment, to divide the uncompressed data segment into a plurality of sub-segments, each of the plurality of sub-segments comprising a subset of the plurality of signal samples, and to determine, for each of the plurality of sub-segments, signal sample bit-removal information for each of the plurality of signal samples of each of the plurality of sub-segments to achieve the desired compression ratio;

a bit-removal module coupled to the bit-removal calculation module, the bit-removal module configured to receive the signal sample bit-removal information and to remove the plurality of bits identified in the signal sample bit-removal information to generate a plurality of compressed signal samples; and wherein the bit-removal calculation module is further configure-to determine, for each of the plurality of sub-segments, a sub-segment compressed bit-width for each of the plurality of signal samples in the sub-segment required to achieve the desired compression ratio, to identify, for each of the plurality of sub-segments, a largest magnitude signal sample of the plurality of signal samples, to determine, for each of the plurality of sub-segments, a bit-width of a binary representation of the largest magnitude signal sample after the number of meaningless bits have been removed and if the bit-width of the binary representation of the largest magnitude signal sample after the number of meaningless bits have been removed is greater than the sub-segment compressed bit-width for each of the plurality of signal samples in the sub-segment required to achieve the desired compression ratio, to calculate the number of sub-segment truncation bits to be equal to the bit-width of the binary representation of the largest magnitude signal sample after the number of meaningless bits have been removed minus the sub-segment compressed bit-width for each of the plurality of signal samples in the sub-segment required to achieve the desired compression ratio.

11. A compressor configured to compress data in a communication system, the compressor comprising:

a bit-removal calculation module configured to receive an uncompressed data segment comprising a plurality of signal samples, to select a desired compression ratio for the uncompressed data segment, to divide the uncompressed data segment into a plurality of sub-segments, each of the plurality of sub-segments comprising a subset of the plurality of signal samples, and to determine, for each of the plurality of sub-segments, signal sample bit-removal information for each of the plurality of signal samples of each of the plurality of sub-segments to achieve the desired compression ratio;

a bit-removal module coupled to the bit-removal calculation module, the bit-removal module configured to receive the signal sample bit-removal information and to remove the plurality of bits identified in the signal sample bit-removal information to generate a plurality of compressed signal samples; and wherein the bit-removal calculation module is further configured to identify the number of bits removed from the plurality of signal samples of a first sub-segment, to calculate a difference between the number of bits removed from the plurality of signal samples of the first sub-segment and the number of bits removed from each of the plurality of signal samples of each of the other sub-segments, to determine if the difference between the number of bits removed from the plurality of signal samples of the first sub-segment and the number of bits removed from each of the plurality of signal samples of each of the other sub-segments meets a predetermined difference and if the predetermined difference has not been met, to identify the sub-segment having a least number of bits removed from each of the plurality of signal samples and to remove an additional number of bits from each of the plurality of signal samples of the sub-segment having the least number of bits removed until the predetermined difference has been met.

12. The compressor of claim 9, further comprising:

a compressed segment builder coupled to the bit-removal calculation module and the bit-removal module, the compressed segment builder configured to receive the signal sample bit-removal information, to encode a header comprising the signal sample bit-removal information for each of the plurality of sub-segments and to generate a compressed data segment comprising the plurality of compressed signal samples and the encoded header.

13. The compressor of claim 11, further comprising:

a compressed segment builder coupled to the bit-removal calculation module and the bit-removal module, the compressed segment builder configured to encode a header to include the number of bits removed from the plurality of signal samples of the first sub-segment and the difference between the number of bits removed from the plurality of signal samples of the first sub-segment and the number of bits removed from each of the plurality of signal samples of each of the other sub-segments.

14. A compressor configured to compress data in a communication system, the compressor comprising:

a bit-removal calculation module configured to receive an uncompressed data segment comprising a plurality of signal samples, to select a desired compression ratio for the uncompressed data segment, to divide the uncompressed data segment into a plurality of sub-segments, each of the plurality of sub-segments comprising a subset of the plurality of signal samples, and to determine, for each of the plurality of sub-segments, signal sample bit-removal information for each of the plurality of signal samples of each of the plurality of sub-segments to achieve the desired compression ratio;

a programmable user control module coupled to the bit-removal calculation module, the programmable user control module configured to receive a desired compression ratio from a user of the communication system and to provide the desired compression ratio to the bit-removal calculation module; and a bit-removal module coupled to the bit-removal calculation module, the bit-removal module configured to receive the signal sample bit-removal information and to remove the plurality of bits identified in the signal sample bit-removal information to generate a plurality of compressed signal samples.

15. The compressor of claim 14, further comprising a segment buffer coupled to the bit-removal module, the segment buffer to receive an uncompressed data segment comprising a plurality of signal samples and to buffer the data segment.

16. The compression module of claim 9, further comprising a programmable user control module coupled to the bit-removal calculation module, the programmable user control module configured to receive a desired compression ratio from a user of the communication system and to provide the desired compression ratio to the bit-removal calculation module.

* * * * *